United States Patent
Lung et al.

(10) Patent No.: US 7,696,503 B2
(45) Date of Patent: Apr. 13, 2010

(54) MULTI-LEVEL MEMORY CELL HAVING PHASE CHANGE ELEMENT AND ASYMMETRICAL THERMAL BOUNDARY

(75) Inventors: Hsiang-Lan Lung, Elmsford, NY (US); Yi-Chou Chen, San Jose, CA (US)

(73) Assignee: Macronix International Co., Ltd., Hsinchu (TW)

(*) Notice: Subject to any disclaimer, the term of this patent is extended or adjusted under 35 U.S.C. 154(b) by 215 days.

(21) Appl. No.: 11/837,636

(22) Filed: Aug. 13, 2007

(65) Prior Publication Data

US 2007/0274121 A1    Nov. 29, 2007

Related U.S. Application Data

(63) Continuation-in-part of application No. 11/155,067, filed on Jun. 17, 2005, now Pat. No. 7,321,130.

(51) Int. Cl.
*H01L 29/02* (2006.01)
(52) U.S. Cl. .................. 257/2; 257/E45.002
(58) Field of Classification Search .............. 257/2, 257/3, 4, 5, E45.002
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |

(Continued)

FOREIGN PATENT DOCUMENTS

WO     0079539     12/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Mark Prenty
(74) *Attorney, Agent, or Firm*—Haynes Beffel & Wolfeld LLP

(57) ABSTRACT

A multi-level, phase change memory cell has first and second thermal isolation materials having different thermal conductivity properties situated in heat-conducting relation to first and second boundaries of the phase change material. Accordingly, when an electrical current is applied to raise the temperature of the memory material, heat is drawn away from the memory material asymmetrically along a line orthogonal to electric field lines between the electrodes.

9 Claims, 11 Drawing Sheets

U.S. PATENT DOCUMENTS

| | | | |
|---|---|---|---|
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,453,081 B2 * | 11/2008 | Happ et al. .................... 257/4 |
| 7,504,653 B2 * | 3/2009 | Lung ............................. 257/2 |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |

FOREIGN PATENT DOCUMENTS

WO      0145108      6/2001

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Axon Technologies Corporation paper: Technology Description, pp. 1-6, 2005.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IDEM 2001, pp. 803-806.

Lankhorst, Martin H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20high%20density%20high%20performance%20phase%20change%20memory <http://klabs.org/richcontent/MAPLDCon99/Papers/P21_Tyson_P.PDF#search='nonvolatile%20high%20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

* cited by examiner

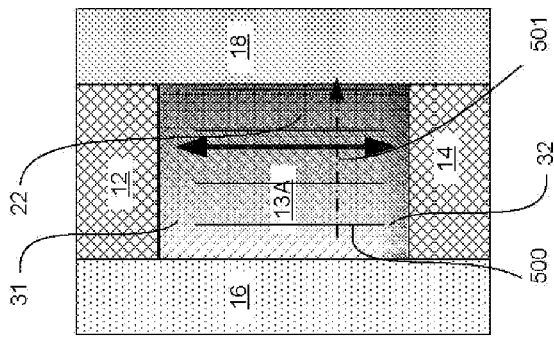
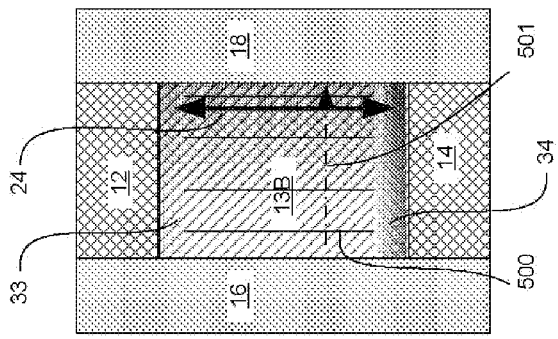
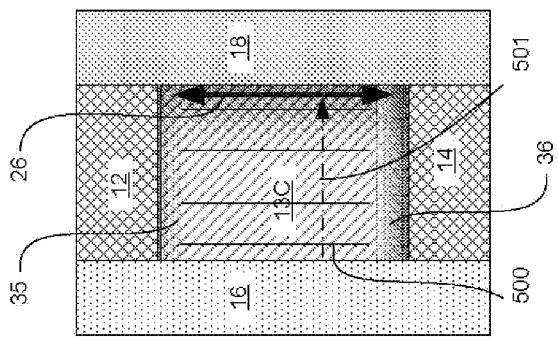
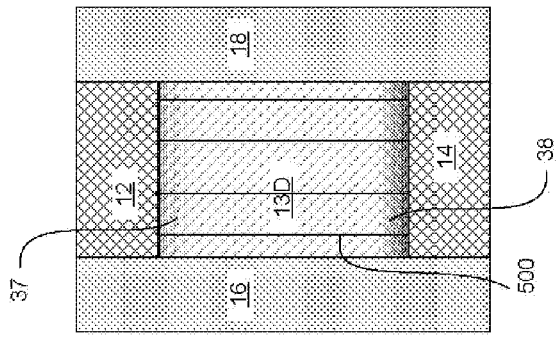
FIG. 2D   FIG. 2C   FIG. 2B   FIG. 2A
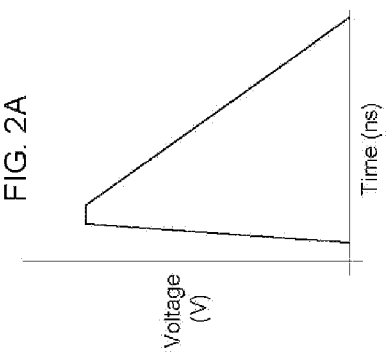
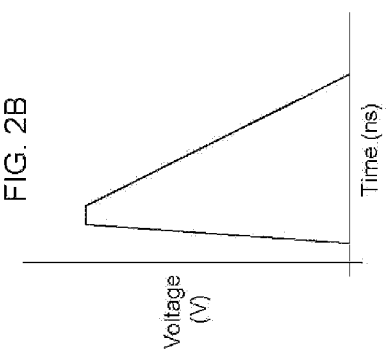
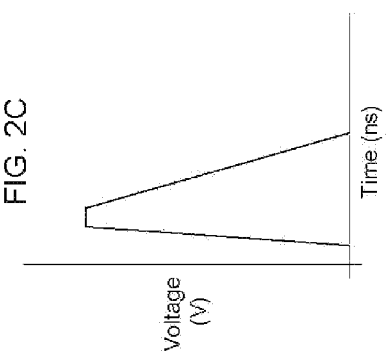
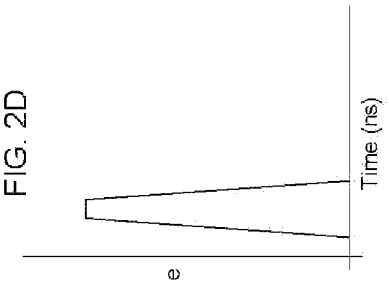
FIG. 2H   FIG. 2G   FIG. 2F   FIG. 2E

MULTI-LEVEL MEMORY CELL HAVING PHASE CHANGE ELEMENT AND ASYMMETRICAL THERMAL BOUNDARY

PARTIES TO A JOINT RESEARCH AGREEMENT

International Business Machines Corporation, a New York corporation, Macronix International Corporation, Ltd., a Taiwan corporation, and Infineon Technologies A.G., a German corporation, are parties to a Joint Research Agreement.

CROSS REFERENCE TO RELATED APPLICATION

This application is a Continuation-in-Part of U.S. application Ser. No. 11/155,067, titled "Thin film fuse phase change RAM and manufacturing method", filed 17 Jun. 2005, which is hereby incorporated herein by reference.

BACKGROUND

1. Field of the Invention

This invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous phase is characterized by higher resistivity than the generally crystalline phase; this difference in resistance can be readily sensed to indicate data. These properties have generated interest in using programmable resistive material to form nonvolatile memory circuits, which can be read and written with random access.

Modulating between amorphous and crystalline phases is achieved by controlling the thermal energy to which the phase change material is subjected. For example, modulating the phase change material from the amorphous phase to the crystalline phase is achieved by heating to a temperature between the glass transition temperature of the phase change material and the melting temperature. This is referred to as "set" and occurs during a relatively low current operation. Modulating from the crystalline phase to the amorphous phase, referred to as "reset," occurs during a relatively high current operation during which melting of the phase change material occurs followed by rapidly cooling the same below its glass transition temperature at a rate to reduce, if not prevent, nucleation and growth of crystallites. To that end, the phase change material may be subjected to a short high current density pulse to melt or break down the crystalline structure so that at least a portion of the phase change structure stabilizes in the amorphous phase at ambient temperatures. By controlling the amount of crystalline and amorphous phases of the material in a phase change element, it is possible to establish multiple memory states in the element, including a reset state comprising a substantially all-amorphous phase in an active region of the material, one or more intermediate states in which mixtures of amorphous phase and crystalline phase in the active region of the material are formed, and a set state comprising a substantially all-crystalline phase in the active region of the material.

During a read operation the phase change material is subjected to a read pulse in order to determine the resistance of the memory element indicating whether the phase change material is in a set state, a reset state or in an intermediate state

SUMMARY

Generally, the invention features a memory device including a multi-level memory cell that includes a memory material switchable between electrical property states by application of energy, coupled to first and second electrodes. First and second thermal isolation materials are situated in heat-conducting relation to first and second boundaries of the phase change material. The first and second thermal isolation materials have different thermal conductivity properties, so that zones of the memory material adjacent the boundaries with the first and second boundaries are subjected to different temperature regimes. Particularly, heat passes more readily from a memory material to a thermal isolation material that has a higher thermal conductivity than to a thermal isolation material having a lower thermal conductivity.

Accordingly, when an electrical current is applied to raise the temperature of the memory material, heat is drawn away from the memory material in a zone adjacent the boundary with the isolation material that has a higher thermal conductivity more rapidly than from the memory material in a zone adjacent the boundary with the isolation material that has a lower thermal conductivity. This can result in more rapid cooling of the memory material in a zone adjacent the boundary with the isolation material that has a higher thermal conductivity than in a zone adjacent the boundary with the isolation material that has a lower thermal conductivity.

An integrated circuit memory is described that comprises an array of memory cells including access circuitry, adapted for storing multiple bits per cell. The memory cells in the array respectively comprise a memory material switchable between a lower resistivity phase and a higher resistivity phase by application of current. The memory material is coupled to first and second electrodes in respective first and second contact areas which define an electric field region within the memory material between the first and second electrodes. The memory material has first and second boundaries between the first and second contact areas. First and second thermal isolation materials lie in heat-conducting relation to the first and second boundaries of the memory material, wherein the first and second thermal isolation materials have different thermal conductivity properties such that heat flow out of the electric field region through the first and second boundaries in the memory material is asymmetrical. A controller is coupled to the array, including resources for applying current to a selected memory cell, the current configured to induce formation of a combination of the lower resistivity phase and the higher resistivity phase in the memory material within the electric field region, the combination establishing a gradient from lower resistivity near the first boundary where there is a greater amount of lower resistivity phase memory material, to higher resistivity near the second boundary where there is a lesser amount of lower resistivity phase memory material, to set a resistance for the memory cell between the first and second electrodes.

In a representative device, the controller is configured to apply a pulse configuration inducing current in the memory cell to program the memory cell to determined value corresponding to a reset state, causing formation of the higher resistivity phase in substantially all of an active volume the memory material. Also, for operation storing at least 2 bits per cell, the controller is configured to determine a data value including at least two bits, for a selected memory cell; and to apply a pulse configuration according to the determined data value that establishes a gradient setting the resistance of the memory cell within a range of resistance corresponding to the determined data value.

In one aspect, the invention features a memory cell comprising a memory material switchable between electrical property states by application of energy, the memory material being coupled to first and second electrodes, and first and second thermal isolation materials in heat-conducting relation to first and second boundaries of the memory material, the first and second thermal isolation materials having different thermal conductivity properties, wherein the first and second electrodes are coupled to access circuitry.

In some embodiments the first and second electrodes each have a top side; a first insulating member between the first and second electrodes comprises the first thermal isolation material; a thin film bridge comprising the memory material crosses the insulating member and defines an inter-electrode path between the first and second electrodes near the top sides of the first and second electrodes; and a second insulating member overlying the thin film bridge comprises the second thermal isolation material. The first and second isolation materials have different thermal conductivities. A memory device includes the memory cell and circuitry operable to access the cells for reading and writing.

In some embodiments the first electrode has a top side and the second electrode has a bottom side, and the memory material is situated between the top side of the first electrode and the bottom side of the second electrode, defining an inter-electrode path between the first and second electrodes; a first thermal isolation material is in heat-conducting relation to a first boundary of the memory material and a second thermal isolation material is in heat-conducting relation to a second boundary of the memory material. The first and second isolation materials have different thermal conductivities.

In another general aspect the invention features a method for making a multi-level memory cell device by forming a first electrode on a substrate; depositing first and second thermal isolation materials over the substrate and over portions of the first electrode, the first and second thermal isolation materials having different thermal conductivities and abutting along a seam; forming a via through the isolation materials at the seam to form a first boundary of the first isolation material and a second boundary of the second isolation material; depositing a phase change material in the via in electrically conductive relation to the first electrode and in thermally conductive relation to the first boundary and to the second boundary; and forming a second electrode in electrically conductive relation to the phase change material; and forming access circuitry electrically connected to the first and second electrodes.

In another general aspect, the invention features a method for making a multi-level memory device, by forming first and second electrodes isolated from one another by a first thermal isolation dielectric; forming a phase change memory material bridge in electrically conductive relation with the first electrode and the second electrode and in thermally conductive relation to a portion of the first thermal isolation dielectric material; and forming a second thermal isolation dielectric material in thermally conducting relation with the phase change memory material bridge, the first and second thermal isolation materials having different thermal conductivities; and forming access circuitry electrically connected to the first and second electrodes.

BRIEF DESCRIPTION OF THE DRAWINGS

FIGS. 2A-2D are sketches in sectional view showing a memory cell device as in FIG. 1, in different states according to an embodiment of the invention.

FIGS. 2E-2H are sketches showing idealized plots of voltage cycles that may be applied to establish states as shown in FIGS. 2A-2D, respectively.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the figures illustrating embodiments of the invention, features corresponding to features shown in other drawings are not all particularly renumbered, although they are all readily identifiable in all the figures.

Figure 1:
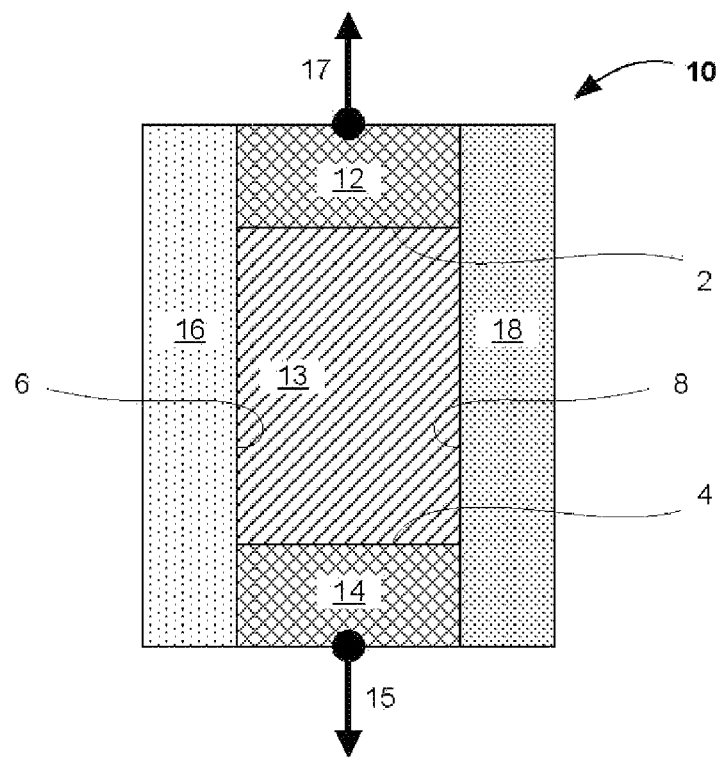
FIG. 1 is a diagrammatic sketch in sectional view showing a memory cell device according to an embodiment of the invention.

Turning now to FIG. 1, there is shown a diagram of a multi-level memory cell 10 according to an embodiment of the invention. The cell includes memory material 13. A first thermal isolation material 16 is in heat-conducting relation to a first boundary 6 of the memory material 13, and a second thermal isolation material 18 is in heat-conducting relation to a second boundary 8 of the memory material 13. A first electrode 14 is in electrically conductive relation with a boundary 4 of the memory material 13, and a second electrode 12 is in electrically conductive relation with a boundary 2 of the memory material 13. The first and second electrodes 12, 14 are electrically connected (15, 17) to access circuitry (not shown in this figure).

Embodiments of memory cell device 10 include phase change based memory materials, including chalcogenide based materials and other materials, for the memory material 13. Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In the disclosure herein, the phase change material is referred to as GST, and it will be understood that other types of phase change materials can be used. A material useful for implementation of a memory device described herein is $Ge_2Sb_2Te_5$.

FIGS. 2A-2D illustrate four different programmable states for a memory cell as in FIG. 1. In each of these figures, the thermal isolation material 16 has a higher thermal conductivity than the thermal isolation material 18. An integrated circuit device includes a controller which applies current to the memory cell in a pulse configuration adapted to establish a resistance in the memory material within a predetermined range that corresponds to a specific data value. In the configuration of FIGS. 2A-2D, the pulses will establish electric field lines from the electrode 12 to the electrode 14 which are generally parallel (with some fringing fields). Current will flow along the electric field lines 500 and induce heat in the cell. As the heat exceeds a melting temperature, the material will change to a liquid state. If the temperature drops quickly enough below the melting temperature, most of the material will solidify in the amorphous state. A slower quenching process however, will result in some material changing to the crystalline phase. Likewise, if a current pulse does not cause the temperature to reach the melting temperature, but exceeds a phase transition temperature, some amorphous material will transition to the crystalline state. Because of the different rates of heat flow out of the memory material on the two boundaries, the temperature levels in the memory material will have a gradient that is generally orthogonal to the electric field lines.

By controlling the pulse configuration applied, this gradient can be relied upon to establish a gradient in resistivity (represented by arrow 501) in the memory material that is generally orthogonal to the electric field lines 500.

A similar gradient can occur as well that is parallel to the electric field lines due to asymmetry in heat flow through the electrodes. This gradient has an effect on the location of the active volume of the memory material. However, the gradient that is generally orthogonal to the electric field lines is the focus of the present technology.

FIG. 2A shows a cell in a relatively low resistance state. Following application of a pulse configuration adapted to program the memory cell to the low resistance state, the memory material in a zone 13A, adjacent the boundary of the memory material with the thermal isolation material 16, is in a generally amorphous phase after the selected pulse configuration. The rest of the memory material remains in a generally crystalline phase. This establishes a gradient in resistivity across the electric field lines in the cell. The electrical resistance of the memory material in the crystalline phase is comparatively low, and electrical current passes readily through, as suggested by the double-headed arrows in FIGS. 2A, 2B and 2C.

The state illustrated in FIG. 2A can be induced by a pulse configuration as shown in FIG. 2E, which increases the temperature of an active volume in the cell above the melting temperature, and then slowly reduces the temperature allowing a substantial volume to re-crystallize. The memory material in a zone 22 adjacent the boundary of the memory material with the thermal isolation material 18 remains in a generally crystalline phase. Portions 31, 32 of the memory material adjacent the boundaries of the memory material with electrodes 12, 14 may also remain in a generally crystalline phase.

Similarly, in the state illustrated in FIG. 2B, the memory material in a zone 24 adjacent the boundary of the memory material with the thermal isolation material 18 remains in a generally crystalline phase and portions 33, 34 of the memory material adjacent the boundaries of the memory material with electrodes 12, 14 may also remain in a generally crystalline phase. Zone 13B remains in a generally amorphous phase. The state illustrated in FIG. 2B can be induced by a pulse configuration as shown in FIG. 2F, which increases the temperature of an active volume in the cell above the melting temperature, and then reduces the temperature, at a rate more quickly than that of FIG. 2E, allowing a first intermediate volume, but a lesser volume than in FIG. 2A, to re-crystallize.

In the state illustrated in FIG. 2C, the memory material in a zone 26 adjacent the boundary of the memory material with the thermal isolation material 18 remains in a generally crystalline phase and portions 35, 36 of the memory material adjacent the boundaries of the memory material with electrodes 12, 14 may also remain in a generally crystalline phase. Zone 13C remains in a generally amorphous phase. The state illustrated in FIG. 2C can be induced by a pulse configuration as shown in FIG. 2G, which increases the temperature of an active volume in the cell above the melting temperature, and then quickly reduces the temperature, at a rate more quickly than that of FIG. 2F, allowing a second intermediate volume, but a lesser volume than in FIG. 2B, to re-crystallize.

In the state illustrated in FIG. 2D, portions 37, 38 of the memory material adjacent the boundaries of the memory material with electrodes 12,14 may remain in a generally crystalline phase, but in this state the bulk of the memory material is in a generally amorphous state. Zone 13D remains in a generally amorphous phase. The state illustrated in FIG. 2D can be induced by a pulse configuration as shown in FIG. 2H, which increases the temperature of an active volume in the cell above the melting temperature, and then quickly reduces the temperature, at a rate more quickly than that of FIG. 2G, allowing none or only a small amount of the volume to re-crystallize.

Figure 3:
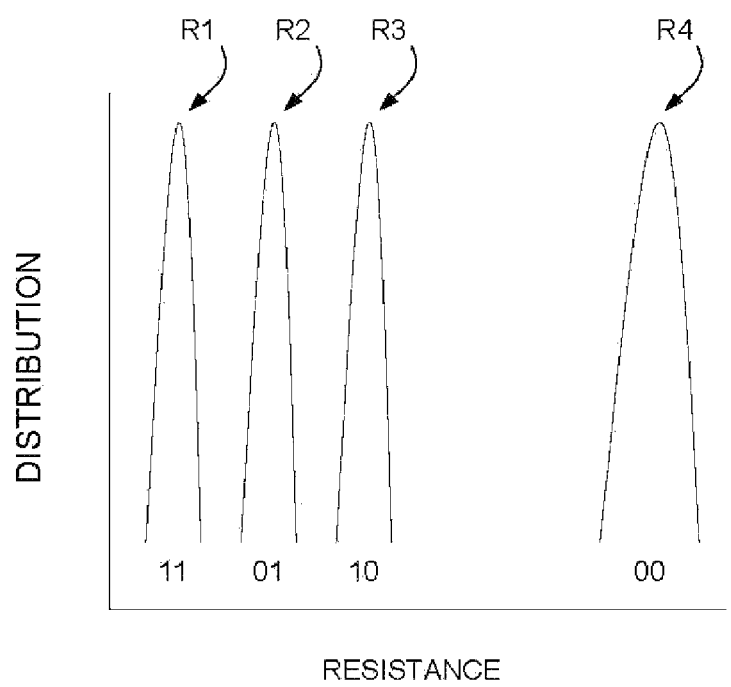
FIG. 3 is an idealized plot of resistivity for the different states of the memory cells device according to the invention, as shown for example in FIGS. 2A-2D corresponding to four different data states.

The states shown in FIGS. 2A-2D will have a gradient in resistivity along a line generally orthogonal to the field lines between the electrodes. Because the cross-sectional area of the zone of amorphous material is different in the different states, or stated alternatively, the gradient in resistivity orthogonal to the field lines is different in different states, the resistance of the cell is also different and, accordingly, the threshold voltage is different for each state. Particularly, R1<R2<R3<R4, where R1, R2, R3 and R4 are the resistances of the cell in the states shown in FIGS. 2A, 2B, 2C and 2D, respectively. Each of the different threshold voltages represents a different program level; as illustrated in FIG. 3. The levels are encoded as: level 0=1 (the state shown in FIG. 2A), level 1=01 (the state shown in FIG. 2B), level 2=10 (the state shown in FIG. 2C), and level 3=00 (the state shown in FIG. 2D).

Other pulse configurations, including configurations that have more than one pulse per program cycle, and configurations which induce varying amounts of crystallization without exceeding the melting temperature of the material, may be applied as suits a particular implementation.

With reference again to FIG. 1, access circuitry, such as described with reference to FIGS. 19 and 20, can be implemented to contact the first electrode 14 and the second electrode 12 in a variety of configurations for controlling the operation of the memory cell, so that it can be programmed to set the phase change material in one of the two solid phases that can be reversibly implemented using the memory material. For example, using a chalcogenide-based phase change memory material, the memory cell may be set to a relatively higher or lower resistivity state in which the memory material in one zone in the current path is an amorphous state, and the rest of the memory material in the current path is in a crystalline state.

A memory cell according to the invention can have any of a variety of configurations. For example, the memory material may be formed in a pore or via at or along a seam that forms the interface between two masses of thermally insulative material. Construction of an embodiment of such a configuration is outlined below with reference to FIGS. 4-11. Or, for example, the memory material may be formed as a bridge structure crossing an inter-electrode dielectric. Construction of an embodiment of such a configuration is outlined below with reference to FIGS. 13-17. Also, memory cells having a "mushroom" style configuration can be implemented as described herein, in which the contact area between the top electrode and the phase change material is much larger than the contact area between the bottom electrode and the memory material, as shown in FIG. 18.

Figure 4:
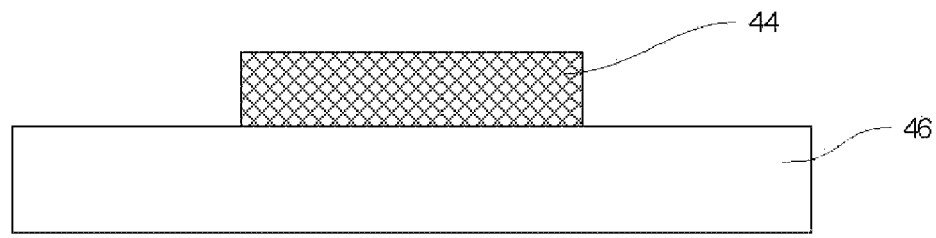
FIGS. 4-11 are diagrammatic sketches in sectional view showing stages in construction of a memory cell having a phase change "pore" configuration according to an embodiment of the invention.

Construction of a cell having the memory material formed in a via will now be described with reference to FIGS. 4-11, showing stages in the process in sectional view. A suitable electrode material is deposited as a layer on a substrate 46, and the layer is patterned to form a first electrode 44, as shown in FIG. 4. The electrode material layer may be formed by a thin film deposition technique such as, for example, sputtering or atomic layer deposition onto the substrate 46 surface. A suitable electrode layer may include layers of two or more materials, selected for their properties, among others, of adhesion to materials on adjacent layers. The bottom electrode layer may include, for example, a film of titanium, followed by a film of titanium nitride on the surface of the titanium film. Titanium adheres well to materials in the underlying semiconductor substrate (such as a silicide); and titanium nitride adheres well to the overlying GST phase change material. Additionally, titanium nitride serves as a good diffusion barrier. A wide variety of materials can be used for the bottom electrode, including for example Ta, TaN, TiAlN, TaAlN; or the material of the bottom electrode may include one or more elements selected from the group consisting of Ti, W, Mo, Al, Ta, Cu, Pt, Ir, La, Ni and Ru, and alloys thereof, or may include a ceramic. The conditions of the deposition processes are established to provide suitable thickness of, and coverage by, the material(s) of the electrode layer, and to provide good thermal isolation. The bottom electrode at the surface of the substrate may have a thickness in a range about 200 nm to about 400 nm.

Figure 5:
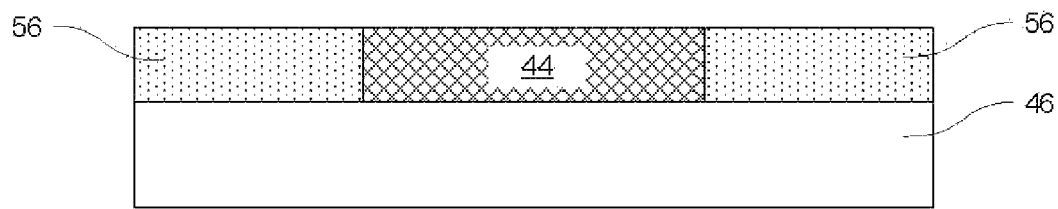

A dielectric fill is then deposited over the structure shown in FIG. 4, and is planarized to form a structure as in FIG. 5, in which the dielectric fill layer 56 surrounds electrode 44. Suitable dielectric fills may include, for example, a low-K dielectric material such as silicon dioxide, silicon oxynitride, silicon nitride, $Al_2O_3$, or other low-K dielectric. Alternatively, the material of the dielectric fill may include one or more elements selected from the group consisting of Si, Ti, Al, Ta, N, O, and C.

Figure 6:
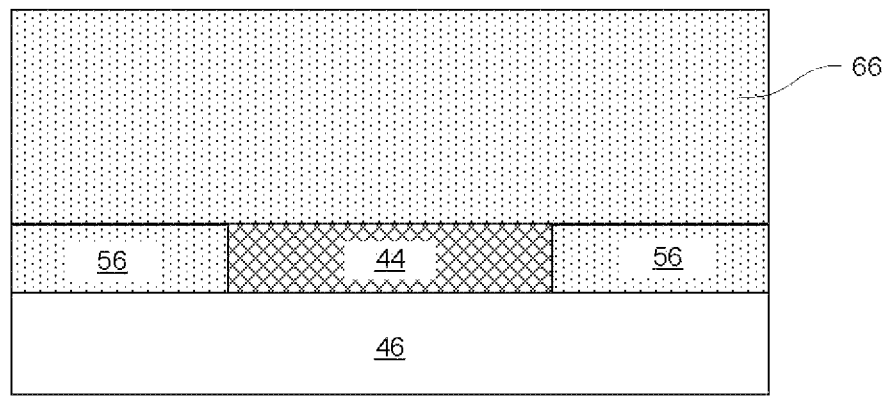

A first thermal isolation material is deposited over the structure shown in FIG. 5 to form a first thermal isolation material layer 66, as shown in FIG. 6. The first thermal isolation material layer 66 is patterned, for example by a mask and etch process, to remove a portion of the first thermal isolation material over the electrode 44, exposing a portion 73 of the surface of the electrode 44 and leaving a portion 74 of the surface of the electrode, and adjacent fill dielectric 56, covered by a mass 76 of the first thermal isolation material, as shown in FIG. 6.

Figure 7:
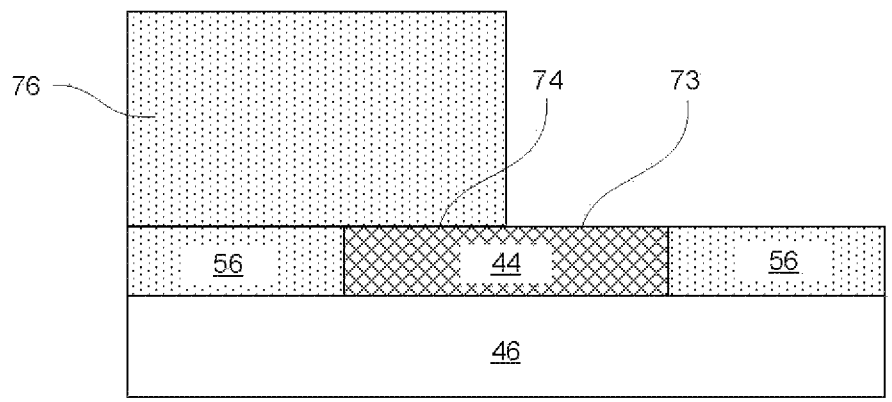
Figure 8:
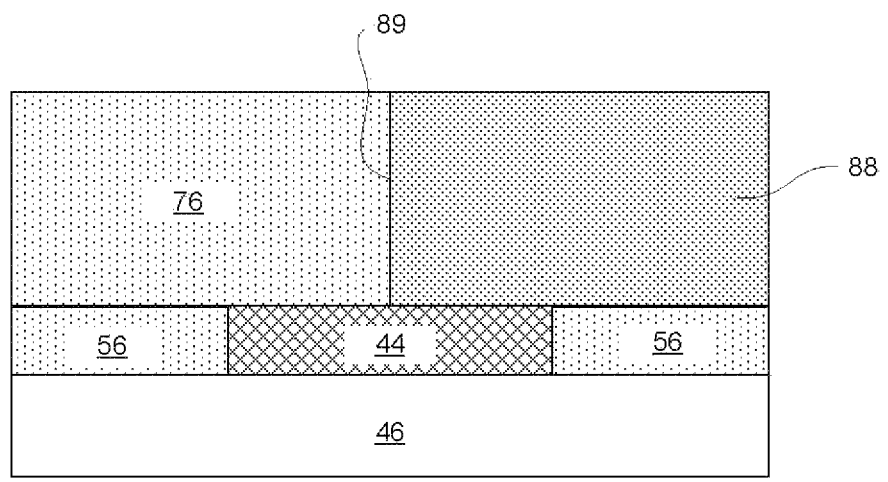

A second isolation material is deposited over the structure shown in FIG. 7, covering the portion 73 of the surface of the electrode 44 and adjacent fill dielectric 56, and then planarized, for example by chemical mechanical polishing, to form the structure shown in FIG. 8. At this stage a portion 74 of the electrode 44 and the adjacent fill dielectric 56 is covered by the first thermal isolation material mass 76 and a portion 73 of the electrode 44 and the adjacent fill dielectric 56 is covered by the second thermal isolation material mass 88. An interface 89 forming a seam between the first and second isolation material masses is situated over the electrode 44.

Figure 9A:
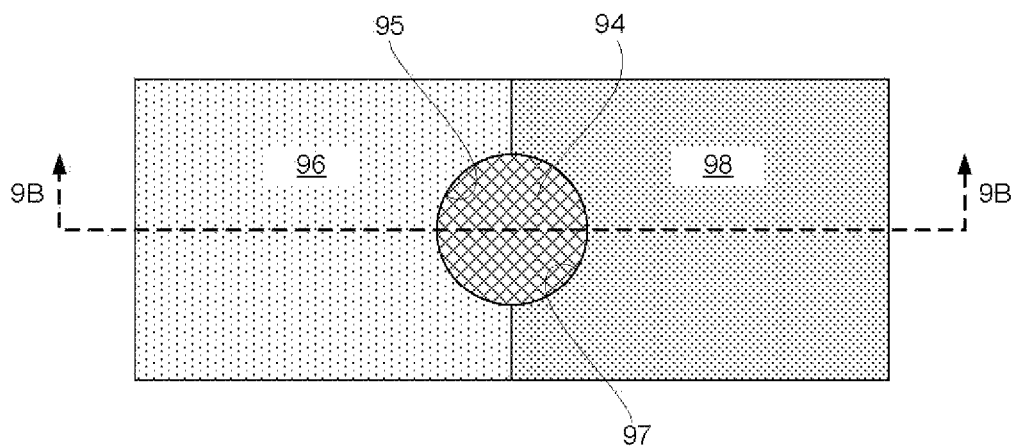
Figure 9B:
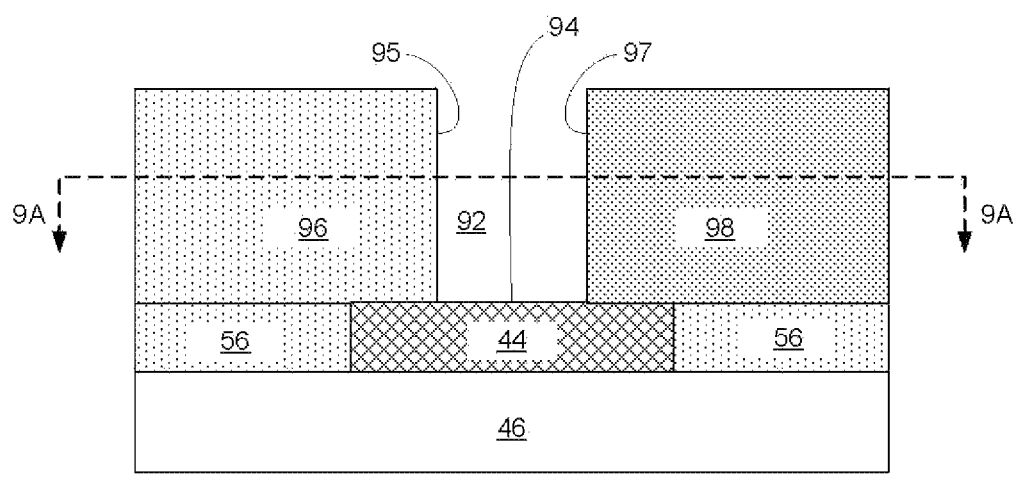

Then a via 92 is formed, for example by a mask and etch process, at the interface 89 between the first and second isolation material masses. FIG. 9A shows a resulting structure in a sectional view at the plane indicated at 9A-9A in FIG. 9B; FIG. 9B shows the structure in a sectional view at the plane indicated at 9B-9B in FIG. 9A. A surface 97 within the via constitutes a boundary of the isolation material 98, and a surface 95 within the via constitutes a boundary of the isolation material 96. An area 94 of the electrode 44 is exposed within the via 92.

Suitable thermal isolation materials include, for example, $SiO_2$ and SiN. The first thermal isolation material is selected as having a higher thermal conductivity than the second thermal isolation material. In some embodiments the ratio of the coefficient of thermal conductivity $\theta 1$ of the first thermal isolation material to the coefficient of thermal conductivity $\theta 2$ of the second thermal isolation material is in a range about 0.20 to about 0.66. For example, the first isolation material may be a selected $SiO_2$ having a $\theta 1$ in the range about 0.5 W/m*K (Watt/meter*degree Kelvin) to about 2.5 W/m*K and the second thermal isolation material may be a selected SiN having a $\theta 2$ in the range 9 W/m*K to about 30 W/m*K. Other materials may be used for the first and second thermal isolation materials.

In other preferred embodiments, the thermal insulators have a thermal conductivity less than that of the amorphous state of the phase change material, or less than about 0.003 J/cm*K*sec for a phase change material comprising GST. Representative materials for thermal insulators include low permittivity (low-K) materials, including materials that are a combination of the elements silicon Si, carbon C, oxygen O, fluorine F, and hydrogen H. Examples of thermally insulating materials which are candidates for use as thermal isolation material include SiCOH, polyimide, polyamide, and fluorocarbon polymers. Other examples of materials which are candidates for use for thermal isolation material include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void lining the walls of the phase change element or otherwise in proximity with one side of the phase change element. A single layer or combination of layers can provide thermal insulation.

Figure 10A:
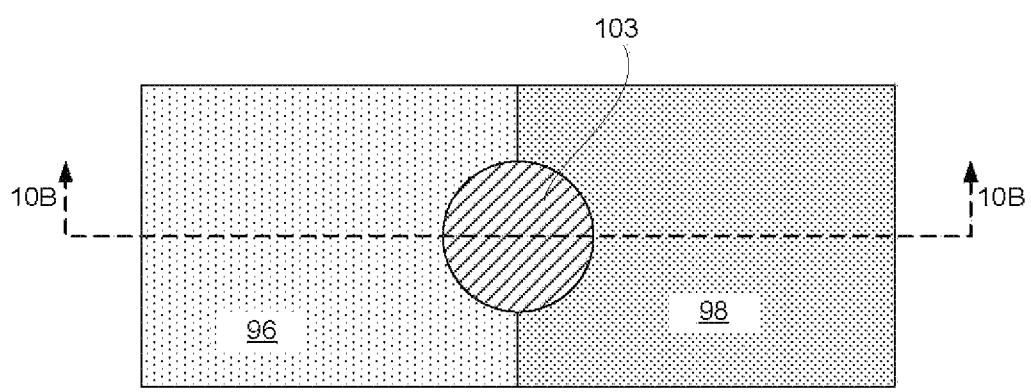
Figure 10B:
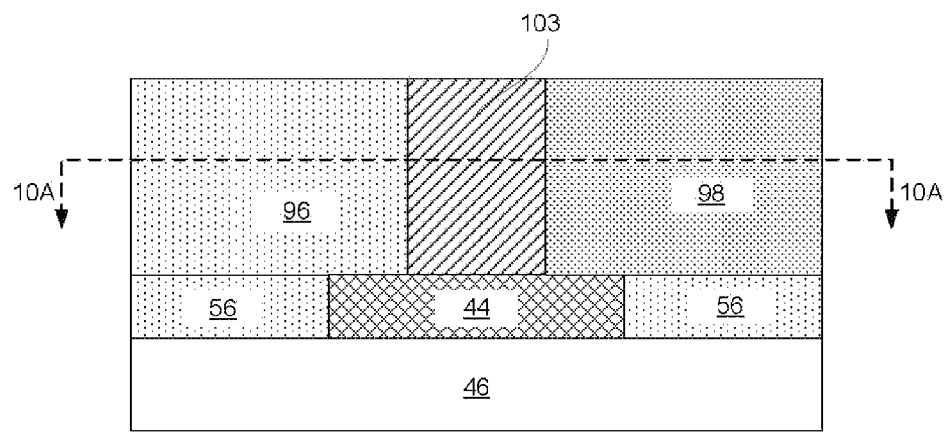
Figure 11:
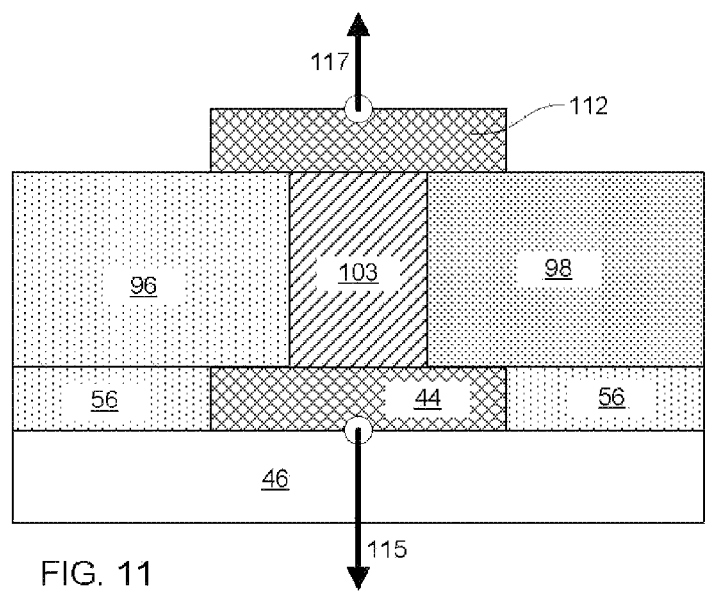

Then a phase change material is deposited in the via, as shown at 103 in FIGS. 10A, 10B. The phase change memory material may be a chalcogenide of the formula $Ge_xSb_yTe_z$ (a "GST"), where x=0-5; y=0-5; and z=0-10, such as, for example, a GST where x:y:z=2:2:5. The phase change material may be doped to tune the properties of the material. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

The chalcogenide phase change memory material is deposited by PVD sputtering or by magnetron-sputtering, using argon, nitrogen, helium or the like or mixtures of such gases as reactive gases, at pressure in the range of about 1 mtorr to about 100 mtorr, and usually at room temperature. Fill-in performance can be improved by using a collimator with an aspect ratio of about 1 to about 5, or by employing a DC bias in the range about 10 V to about 1000 V (such as several tens of volts to several hundred volts), or by a concurrent use of both a collimator and a DC bias. Following deposition the chalcogenide, material may be annealed to improve the crystalline state. The post deposition anneal can be done, for example, under vacuum or nitrogen ambient, at temperatures in the range of about 100° C. to about 400° C. for a time less than 30 minutes. Alternative processes using chemical vapor deposition can be applied to phase change materials as well.

The thickness of the chalcogenide plug depends upon the design of the cell structure. Generally a chalcogenide plug having a thickness greater than about 8 nm can show a phase change characteristic with bistable resistance. The deposited chalcogenide material over the thermal isolation material can be removed using chemical mechanical polishing or other technology for planarizing the resulting structure.

Where the memory material is deposited by sputtering, the conditions may include, for example, nitrogen or argon gas (or a mixture of argon and nitrogen); the target may be GeSbTe if only argon gas is used, or, if $Ar/N_2$ gas is used, the target may be $N_2$—GeSbTe.

Then an electrically conductive material suitable for a top electrode, such as a metal or metal-based or non-metal material, such as, e.g.: copper; aluminum; titanium (Ti) and titanium-based materials such as titanium nitride (TiN), titanium oxynitride (TiON); tantalum (Ta) and tantalum-based materials such as tantalum nitride (TaN); polysilicon, tungsten-based materials such as tungsten silicide ($WSi_x$); and, for a low thermal conductivity electrode, materials such as LNO ($LaNiO_3$) and LSMO ($LaSrMnO_3$), is deposited over the structure of FIGS. 10A, 10B, and is patterned to form a top electrode 112 in electrically conductive relation to the memory material 103. The top electrodes may be patterned as islands, or as lines (straplines or bitline). The top electrode may have a thickness, for example, in a range of about 200 Å to about 5000 Å, usually about 2000 Å.

Access circuitry (such as is diagrammed for example in FIGS. 19 and 20) is then constructed to connect (as diagrammed at 115, 117 in FIG. 11) to electrodes 44 and 112.

Figure 12:
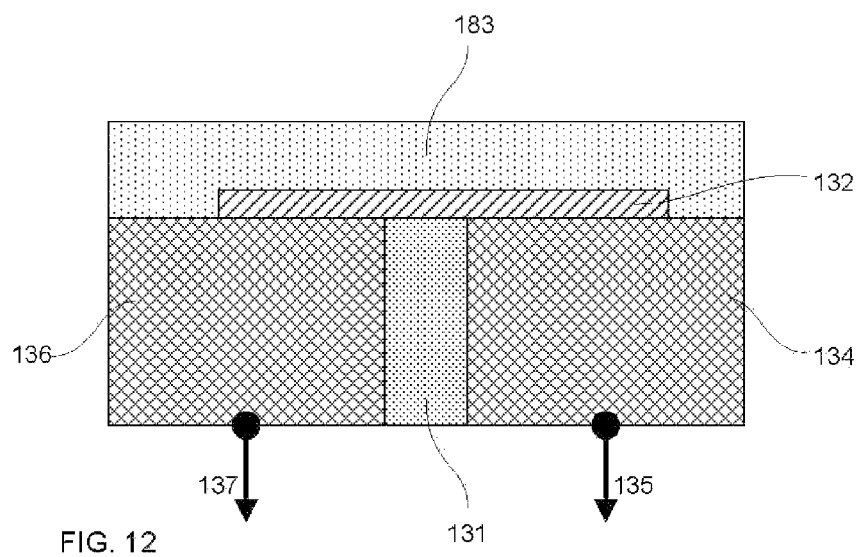
FIG. 12 is a diagrammatic sketch in sectional view showing a memory cell device having a "bridge" configuration according to an embodiment of the invention.

A cell having the memory material formed as a bridge structure crossing an inter-electrode dielectric is shown in diagrammatic sectional view in FIG. 12. The cell includes a first electrode 134 and a second electrode 136 isolated by a first dielectric thermal isolation material 131. The electrodes 134,136 are connected to access circuitry as shown at 135, 137. A "bridge" of phase change material 132 is situated in electrically conductive relation to the first and second electrodes and in thermally conductive relation to the first dielectric thermal isolation material. A second dielectric thermally conductive material overlies the phase change material bridge 132 and is in thermally conductive relation to the phase change material bridge.

Figure 13:
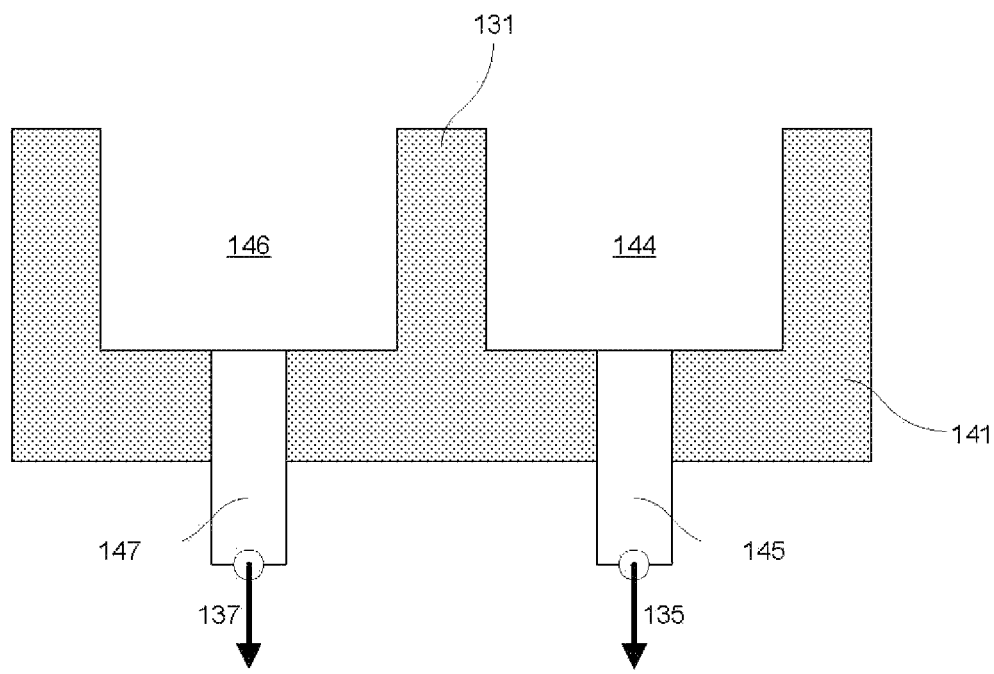
FIGS. 13-17 are diagrammatic sketches in sectional view showing stages in construction of a memory cell having a "bridge" configuration according to an embodiment of the invention.
Figure 14:
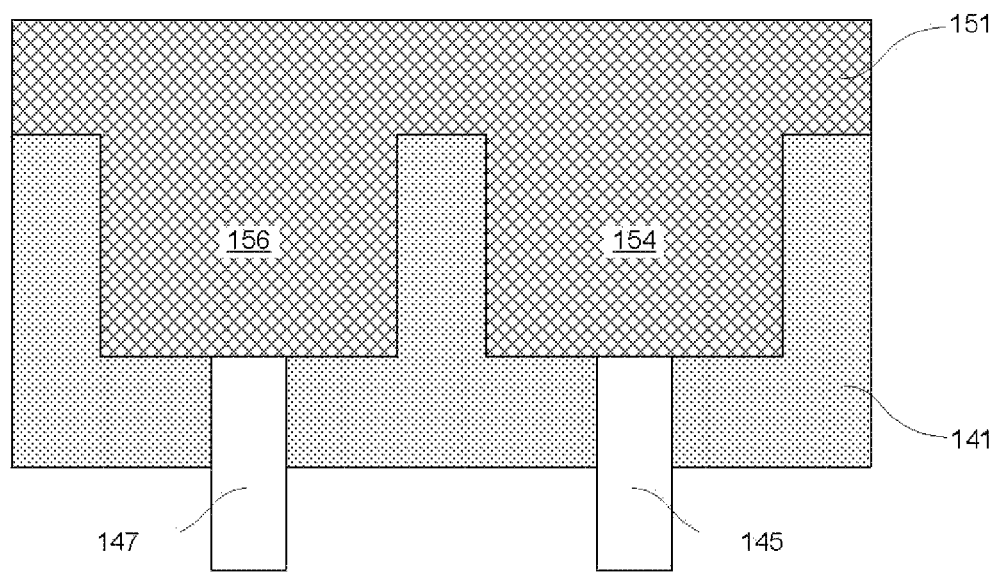

Construction of a cell having the memory material formed as a bridge structure crossing an inter-electrode dielectric is described in U.S. application Ser. No. 11/155,067, referred to above. A process for forming such a cell will now be outlined with reference to FIGS. 13-17, showing stages in the process in sectional view. FIG. 13 shows a stage in the process in which the first dielectric thermal isolation material 141 has been patterned on a substrate. Voids 144,146 are formed in the first dielectric isolation material. Tungsten plugs 145,147 are provided for interconnection with control circuitry, and an area of the plugs 145,147 is exposed in the voids 144, 146. The structure as shown in FIG. 14 can be formed by, for example a damascene process.

Figure 15:
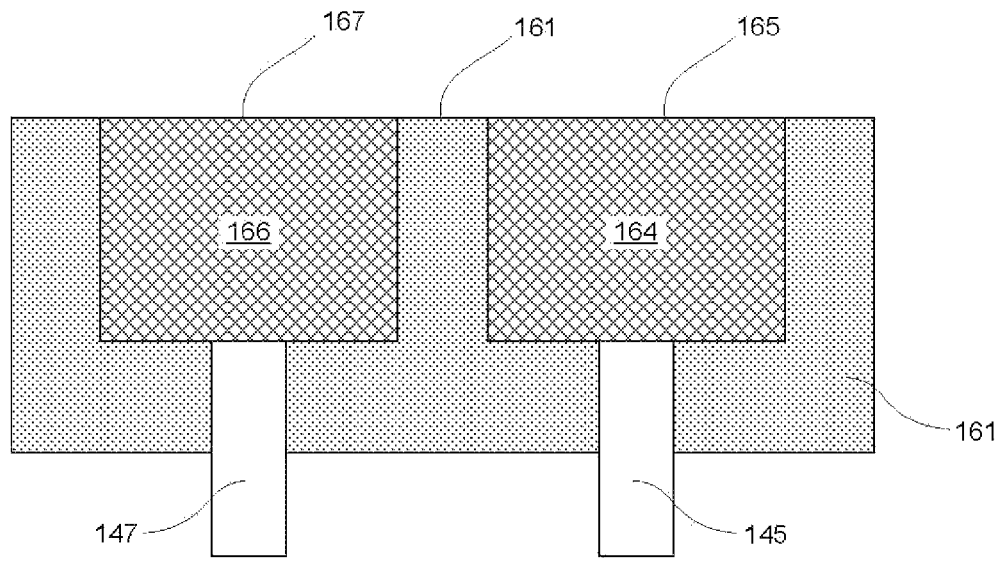

Thereafter a first electrode material 151 is deposited over the structure shown in FIG. 14, filling the voids 144,146 as shown at 154,156 in FIG. 15.

Then a superficial portion of the deposited electrode material 151 is removed, for example in a planarizing process, to expose the first thermal isolation material 161 between the first electrode bodies 164,166, and effectively isolating the first and second electrode bodies 164,166, and top surfaces 165, 167 of the electrode bodies 164, 166.

Figure 16:
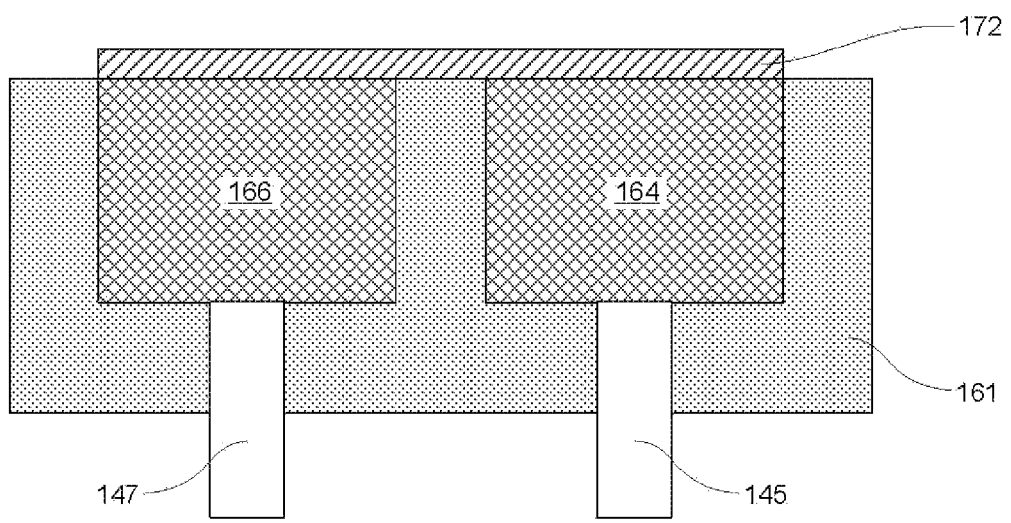

Thereafter a bridge 172 of memory material is formed (for example, by a deposition followed by a patterned etch), over the surface of the structure of FIG. 16 in electrically conductive relation with the first electrode 164 and with the second electrode 166, and in heat-conducting relation with a surface of the first dielectric isolation material between the electrodes.

Figure 17:
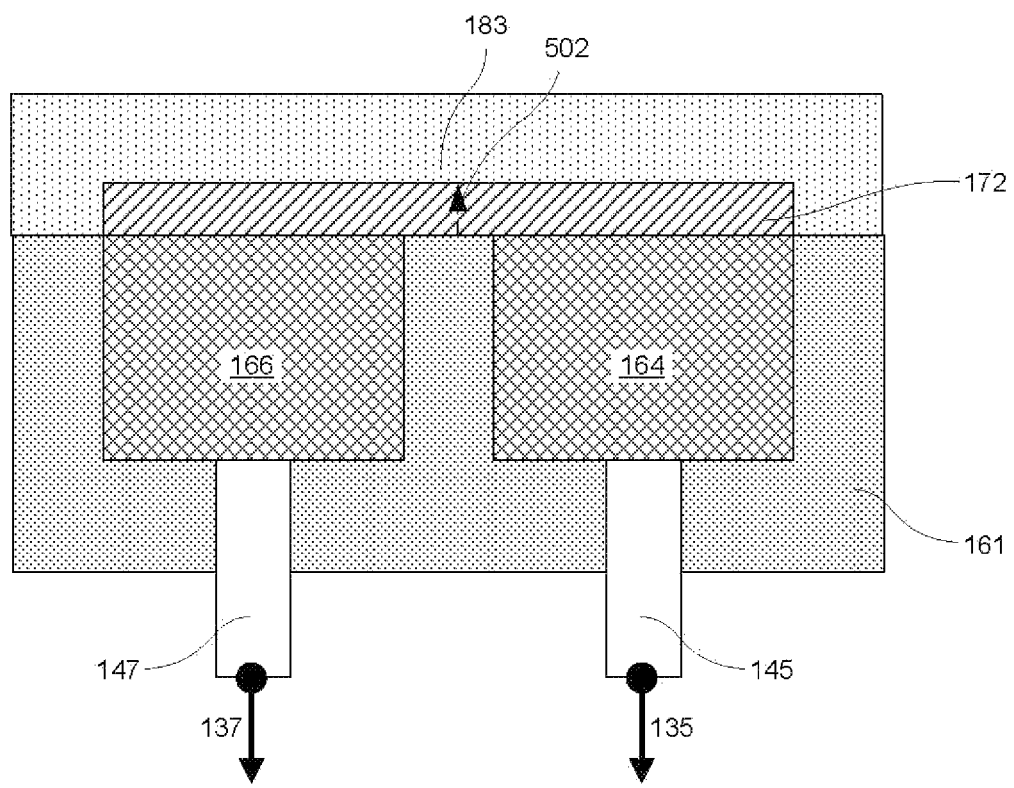
Figure 18:
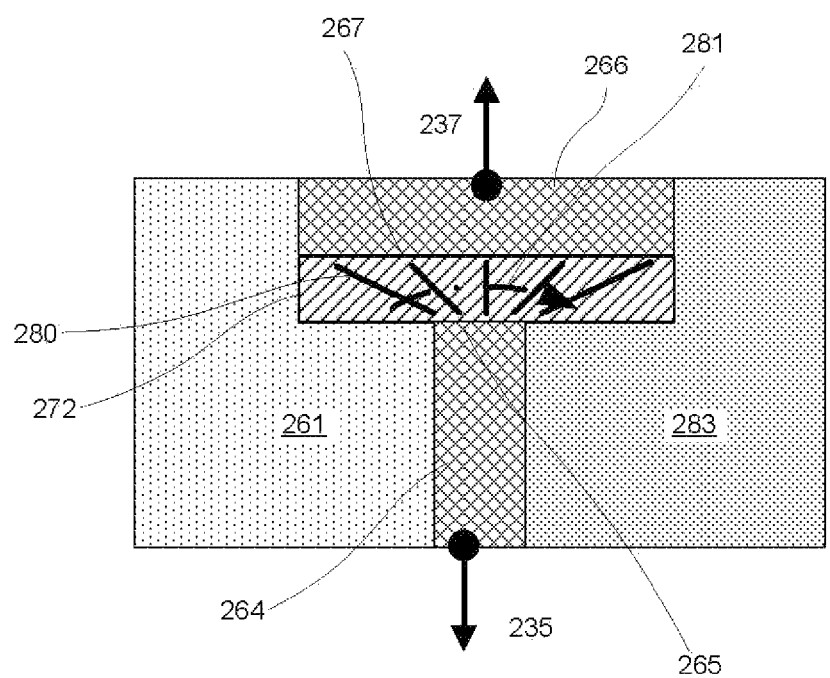
FIG. 18 is a diagrammatic sketch in sectional view showing a memory cell device having a "mushroom" configuration according to an embodiment of the invention.

Thereafter a second dielectric thermal isolation material 183 is deposited over the structure of FIG. 17, in heat conducting relation with the exposed surface of the memory material 172.

In the resulting memory cell structure (e.g., FIG. 17) a current path runs from the access circuitry at 135,145 to the first electrode 164, then into the memory material bridge 172 and along field lines which run generally in parallel between the electrodes (not shown) across the bridge 172 to the second electrode 166 and out to the access circuitry at 147,137. At the portion of the bridge that spans between the first and second electrodes 164,166, the bridge is in thermally conductive relation to the first dielectric isolation material at an interface between the bridge 172 and the first isolation material 161, and the bridge is in thermally conductive relation to the second dielectric isolation material at an interface between the bridge 172 and the second isolation material 183. As noted above, the first and second thermal isolation materials have different thermal conductivities, so that following a current spike there is a more rapid quench of the memory material near the interface with the thermal isolation material having the greater thermal conductivity characteristic. This results in a gradient in resistivity along a line (represented by arrow 502 in FIG. 17) generally orthogonal to the field lines between the first and second electrodes 164,166.

FIG. 18 is a simplified diagram of a "mushroom" style memory cell. A first electrode 264 is coupled to access circuitry 235 and a second electrode 266 is coupled access circuitry 237. The first electrode 264 is formed in a pore on a seam between a first thermal isolation material 261 on the right side boundary of the memory element 272 and a second thermal isolation material 283 on the left side boundary of the memory element 272 and coplanar with the first thermal isolation material 261. A memory element 272 comprises a strip of phase change material having a small contact area 265 with the first electrode and a substantially larger contact area 267 with the second electrode. The smaller contact area 265 concentrates the current flow, and the electric field lines 280 between the first and second electrodes 264,266, causing greater current density and therefore greater resistive heating in a small active volume near the contact area 265. First thermal isolation material 261 is on the right side boundary of the memory element 272 and a second thermal isolation material 283 is on the left side boundary of the memory element 272. The first and second thermal isolation materials have different thermal conductivities, causing asymmetrical heat flow orthogonal to the field lines in the memory element 272. Thus, the memory elements can be programmed using a pulse configuration that induces a gradient in resistivity as discussed above along a line (represented by the arrow 281) generally orthogonal to the field lines 280 between the electrodes.

Figure 19:
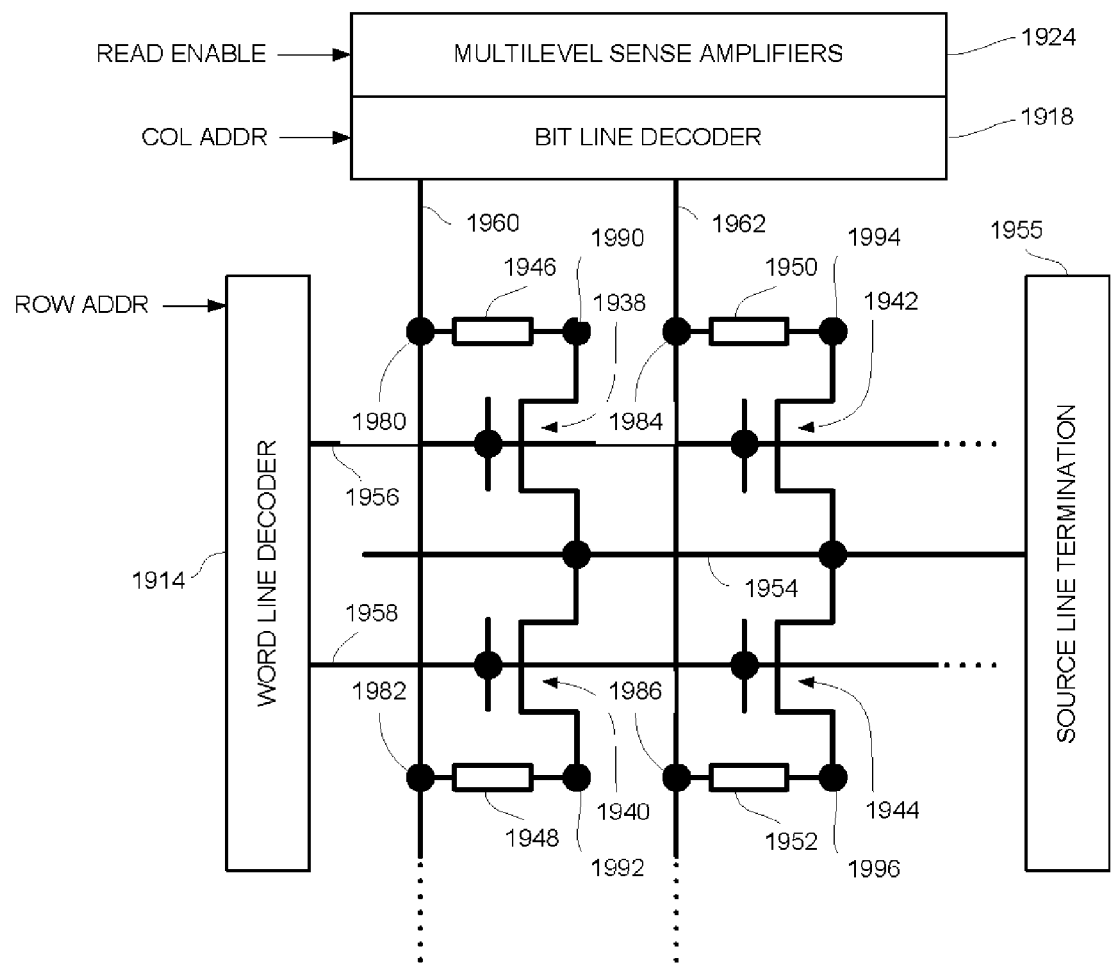
FIG. 19 is a block diagram of an integrated circuit device according to an embodiment of the invention.

FIG. 19 is a schematic illustration of a memory array, which can be implemented as described herein. In the schematic illustration of FIG. 20, a common source line 1954, a word line 1956 and a word line 1958 are arranged generally parallel in the Y-direction. Bit lines 1960 and 1962 are arranged generally parallel in the X-direction. Thus, a Y-decoder and a word line driver in block 1914 are coupled to the word lines 1956, 1958. An X-decoder in block 1918 and a set of multilevel sense amplifiers in block 1924 are coupled to the bit lines 1960 and 1962. The common source line 1954 is coupled to the source terminals of access transistors 1938, 1940, 1942 and 1944 and to source line termination 1955. The gate of access transistor 1938 is coupled to the word line 1956. The gate of access transistor 1940 is coupled to the word line 1958. The gate of access transistor 1942 is coupled to the word line 1956. The gate of access transistor 1944 is coupled to the word line 1958. The drain of access transistor 1938 is coupled to the bottom electrode member 1990 for memory cell 1946, which has top electrode member 1980. The top electrode member 1980 is coupled to the bit line 1960. Likewise, the drain of access transistor 1940 is coupled to the bottom electrode member 1992 for memory cell 1948, which has top electrode member 1982. The top electrode member 1982 is coupled to the bit line 1960. Access transistors 1942 and 1944 are coupled to corresponding memory cells 1950, 1952 similarly, by way of bottom electrode members 1994,1996 and top electrode members 1984,1986, on bit line 1962. It can be seen that in this illustrative configuration the common source line 1954 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 20:
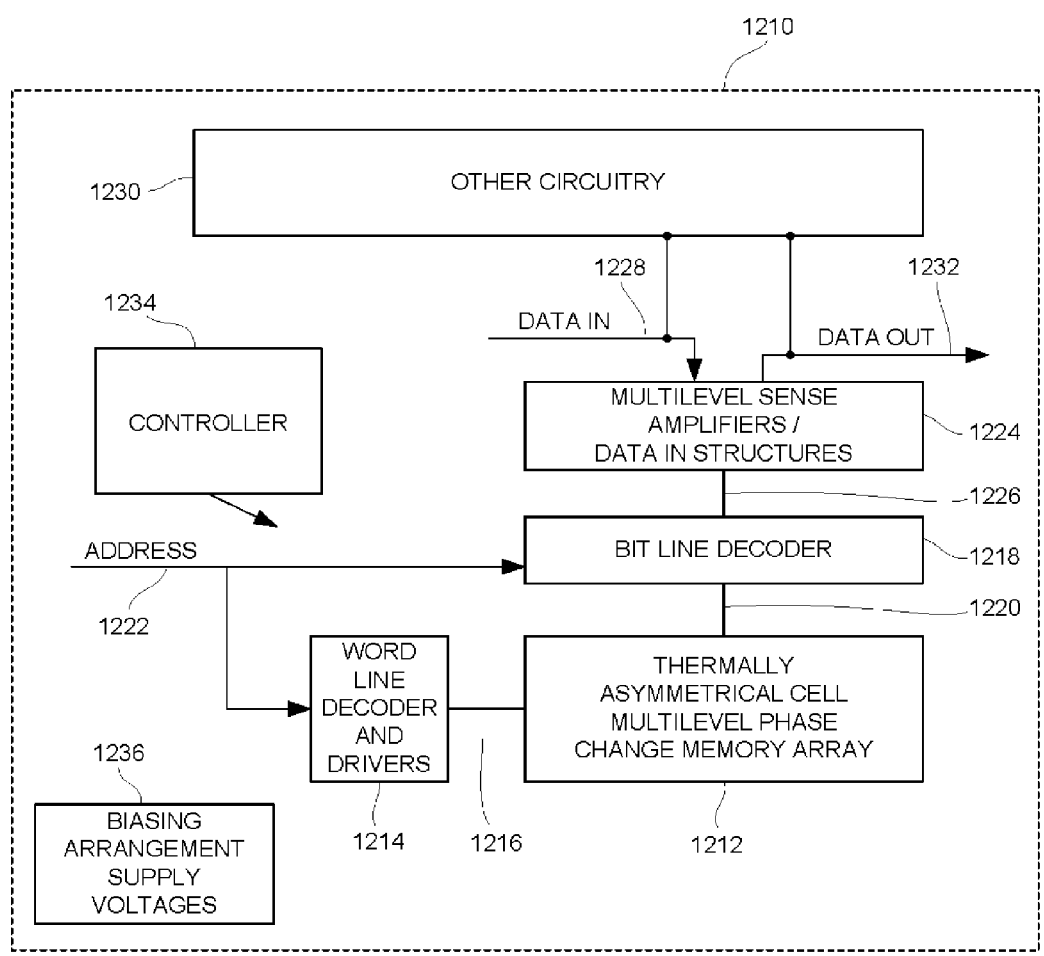
FIG. 20 is a partial schematic diagram of a representative memory array as shown in FIG. 19.

FIG. 20 is a simplified block diagram of an integrated circuit in accordance with an embodiment. The integrated circuit 1210 includes a memory array 1212 implemented using phase change memory cells as described herein having a self-aligned bottom electrode with self-converged critical dimensions, on a semiconductor substrate. A word line (or row) decoder 1214 is coupled to, and in electrical communication with, a plurality of word lines 1216, and arranged along rows in the memory array 1212. A bit line (column) decoder and drivers 1218 are coupled to and in electrical communication with a plurality of bit lines 1220 arranged along columns in the memory array 1212 for reading data from, and writing data to, the phase change memory cells in the memory array 1212. Addresses are supplied on bus 1222 to the word line decoder and drivers 1214 and to the bit line decoder 1218. Sense amplifiers and data-in structures in block 1224, including current sources for the read, set and reset modes, are coupled to the bit line decoder 1218 via data bus 1226. Data is supplied via the data-in line 1228 from input/output ports on the integrated circuit 1210 or from other data sources internal or external to the integrated circuit 1210, to the data-in structures in block 1224. In the illustrated embodiment, other circuitry 1230 is included on the integrated circuit 1210, such as a general purpose processor or special purpose application circuitry, or a combination of modules providing system-on-a-chip functionality supported by the phase change memory cell array. Data is supplied via the data-out line 1232 from the sense amplifiers in block 1224 to input/output ports on the integrated circuit 1210, or to other data destinations internal or external to the integrated circuit 1210.

A controller implemented in this example, using bias arrangement state machine 1234, controls the application of bias arrangement supply voltages and current sources 1236, such as read, program erase, erase verify, program verify voltages or currents for the word lines and bit lines, and controls the word line/source line operation using an access control process. The controller 1234 can be implemented using special purpose logic circuitry as known in the art. In alternative embodiments, the controller 1234 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 1234.

The controller is arranged for programming multiple bits per cell in the array 1212 of multilevel cells as discussed above in connection with FIGS. 2A-2H. For example, a data level 00 may be programmed by applying a reset pulse after which substantially all of an active volume of selected memory cells are left in an amorphous state; a data level 01 may be programmed by applying a pulse or pulse combination after which a relatively small portion of the active volume is left in a crystalline state; a data level 10 may be programmed by applying a pulse or pulse combination after which an intermediate sized portion of the active volume is left in a crystalline state; and a data level 10 may be programmed by applying a pulse or pulse combination after which a relatively large portion, or all, of the active volume is left in a crystalline state.

Embodiments of memory cell devices include phase change based memory materials, including chalcogenide based materials and other materials, for the memory material. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO$_3$, Ag—GeTe, PrCaMnO, ZnO, Nb$_2$O$_5$, Cr—SrTiO$_3$.

For additional information on the manufacture, component materials, use and operation of phase change random access memory devices, see U.S. patent application Ser. No. 11/155,067, referenced above.

Other embodiments are in the following claims.

What is claimed is:

1. An integrated circuit memory, comprising:
an array of memory cells including access circuitry, memory cells in the array respectively comprising:
a memory material switchable between a lower resistivity phase and a higher resistivity phase by application of current, the memory material being coupled to first and second electrodes in respective first and second contact areas which define an electric field region within the memory material between the first and second electrodes, the memory material having first and second boundaries between the first and second contact areas, and wherein the first and second electrodes are coupled to the access circuitry; and
first and second thermal isolation materials in heat-conducting relation to the first and second boundaries of the memory material, the first and second thermal isolation materials having different thermal conductivity properties such that heat flow out of the electric field region through the first and second boundaries in the memory material is asymmetrical.

2. The integrated circuit memory of claim 1, further comprising:
a controller coupled to the array, including resources for applying current to a selected memory cell, the current configured to induce formation of a combination of the lower resistivity phase and the higher resistivity phase in the memory material within the electric field region, the combination establishing a gradient from lower resistivity near the first boundary to higher resistivity near the second boundary to set a resistance for the memory cell between the first and second electrodes.

3. The integrated circuit memory of claim 2, wherein the controller is configured to apply a pulse configuration inducing current in the memory cell to program the memory cell to a determined value corresponding to a reset state, causing formation of the higher resistivity phase in substantially all of an active volume the memory material.

4. The integrated circuit memory of claim 2, wherein the controller is configured to determine a data value including at least two bits, for a selected memory cell; and to apply a pulse configuration according to the determined data value that establishes a gradient setting the resistance of the memory cell within a range of resistance corresponding to the determined data value.

5. The integrated circuit memory of claim 1, wherein:
the first and second electrodes each have a top side;
a first insulating member between the first and second electrodes comprises the first thermal isolation material;
a thin film bridge comprising the memory material crosses the insulating member and defines an inter-electrode path between the first and second electrodes near the top sides of the first and second electrodes; and
a second insulating member overlying the thin film bridge comprises the second thermal isolation material.

6. An integrated circuit memory, comprising:
an array of memory cells including access circuitry, memory cells in the array respectively comprising:
a memory material switchable between a lower resistivity phase and a higher resistivity phase by application of current, the memory material being coupled to first and second electrodes in respective first and second contact areas which define an electric field region within the memory material between the first and second electrodes, the memory material having first and second boundaries between the first and second contact areas, and wherein the first and second electrodes are coupled to the access circuitry; and first and second thermal isolation materials in heat-conducting relation to the first and second boundaries of the memory material, the first and second thermal isolation materials having different thermal conductivity properties such that heat flow out of the electric field region through the first and second boundaries in the memory material is asymmetrical; and a controller coupled to the array, including resources for applying current to a selected memory cell, the current configured to induce formation of a combination of the lower resistivity phase and the higher resistivity phase in the memory material within the electric field region, the combination establishing a gradient from lower resistivity near the first boundary to higher resistivity near the second boundary to set a resistance for the memory cell between the first and second electrodes, and wherein:

the first electrode has a top side and the second electrode has a bottom side, and the memory material is situated between the top side of the first electrode and the bottom side of the second electrode, defining an inter-electrode path between the first and second electrodes; and the first thermal isolation material is in heat-conducting relation to the first boundary of the memory material and the second thermal isolation material is in heat-conducting relation to the second boundary of the memory material.

7. The integrated circuit memory of claim 1, wherein the first and second thermal insulating materials comprise respective co-planar thin films which abut along a seam, and the memory elements comprise phase change material within pores along the seam and contact bottom electrodes beneath the co-planar thin films.

8. The integrated circuit memory of claim 1, wherein the first contact area is substantially smaller than the second contact area.

9. The integrated circuit memory of claim 1, wherein the first and second thermal insulating materials comprise respective co-planar thin films which abut along a seam, and the first electrodes comprise conductive members within pores along the seam, and contact the first contact areas on the memory material over the co-planar thin films, wherein the first contact area is substantially smaller than the second contact area; and the memory material comprising strips of programmable resistance material that cross the seam over the first electrodes.

* * * * *